United States Patent [19]
Smith

[11] Patent Number: 5,994,781
[45] Date of Patent: Nov. 30, 1999

[54] SEMICONDUCTOR CHIP PACKAGE WITH DUAL LAYER TERMINAL AND LEAD STRUCTURE

[75] Inventor: John W. Smith, Palo Alto, Calif.

[73] Assignee: Tessera, Inc., San Jose, Calif.

[21] Appl. No.: 09/086,863

[22] Filed: May 29, 1998

Related U.S. Application Data

[60] Provisional application No. 60/048,179, May 30, 1997.

[51] Int. Cl.$^6$ .......................... H01L 23/48; H01L 23/52; H01L 29/40
[52] U.S. Cl. ........................ 257/773; 257/776; 257/780; 257/692
[58] Field of Search ..................................... 257/776, 773, 257/758, 759, 786, 780, 781, 692

[56] References Cited

U.S. PATENT DOCUMENTS 5,148,265  9/1992  Khandros et al. .
5,148,266  9/1992  Khandros et al. .

FOREIGN PATENT DOCUMENTS

WO 94/03036  2/1994  WIPO .
WO 97/40958  11/1997  WIPO .

Primary Examiner—Sheila V. Clark
Attorney, Agent, or Firm—Lerner, David, Littenberg, Krumholz & Mentlik, LLP

[57] ABSTRACT

An assembly for packaging a microchip has a dielectric element including a top dielectric layer having a bottom surface. Traces extend at the bottom surface to connect terminals of the dielectric layer to conductive elements, the conductive elements being connected to contacts on a chip. Each trace has a terminal to which it is electrically connected. Traces extend beneath terminals to which they are not electrically connected.

20 Claims, 6 Drawing Sheets

SEMICONDUCTOR CHIP PACKAGE WITH DUAL LAYER TERMINAL AND LEAD STRUCTURE

CROSS-REFERENCE TO RELATED APPLICATIONS

This application claims benefit of U.S. Provisional Application Ser. No. 60/048,179 filed May 30, 1997, the disclosure of which is incorporated by reference herein.

FIELD OF THE INVENTION

The present invention relates to the art of electronic packaging, and more specifically to assemblies incorporating semiconductor chips.

BACKGROUND OF THE INVENTION

Packaging for semiconductor chips and related microelectronic devices may incorporate a dielectric element and terminals for connecting the chip with other electronic elements in an electronic device. As disclosed, for example, in certain embodiments of U.S. Pat. Nos. 5,148,265 and 5,148,266, the disclosures of which are hereby incorporated by reference herein, a semiconductor chip can be provided with a flexible dielectric structure having terminals thereon. The terminals on the flexible dielectric are connected to contacts on the chip by flexible leads, so that the terminals remain movable with respect to the chip. The dielectric structure may incorporate a compliant layer disposed between the terminals and the chip, which aids in mechanically decoupling the terminals from the chip. The flexible dielectric, flexible leads and compliant layer of the flexible dielectric aid in reducing stresses developed in the leads as the operation of the chip creates heat and thermal expansion within the chip and dielectric structure.

The configuration of the leads and the terminals affects the dimensions of the entire assembly. This is a concern in the semiconductor chip packaging art, as the dimensions of the assembly affects the transmission time for signals transmitted within the electronic device in which the assembly is incorporated. Delays in transmission of these signals limit the speed of operation for the electronic device. In certain embodiments taught in the '265 and '266 patents, the terminals are arranged in a "fan-in" pattern, so that the terminals are disposed over the chip itself and the size of the assembly is thereby reduced. For example, where the contacts on the chip are arranged in rows at the periphery of the chip, the terminals may be arranged on the dielectric structure overlying the central region of the chip's front surface. Electrically conductive traces may extend inwardly along the dielectric structure from the flexible outer portions of the leads to the terminals. In addition, the terminals may be arranged in a so-called "area array," i.e., an array of terminals substantially distributed over the available surface area of the dielectric structure. This maximizes the spacing between terminals for a given structure size and number of terminals, since the terminals are arranged in a two-dimensional array, as opposed to being arranged in only one or two rows.

As disclosed in the '265 and '266 patents, the terminals may be disposed either on the surface of the dielectric structure remote from the chip, or on the surface opposite the chip. For example, in the '266 patent, one embodiment uses a first dielectric layer, having a first face directed towards the chip and a second face directed away from the chip. The traces and terminals are disposed on the second face of this first layer. A further dielectric layer is provided by applying a material over the second face and the terminals and traces of the first layer. Holes or vias are then formed in the further layer to expose the terminals beneath. Conductive filler such as solder is then applied in the vias so that solder masses form bonding terminals extending over the face of the second layer remote from the chip.

In other structures, the traces and terminals may be formed on the first or chip-facing surface of a preformed dielectric layer such as a polyimide sheet and holes may be formed in the polyimide sheet in alignment with the terminals. Here again, electrically conductive terminals are deposited in the holes to form further, bonding terminals on the second surface of the dielectric structure, remote from the chip. Terminals formed from electrically conductive masses such as solder bumps and terminals designed to accommodate solder bumps are generally larger in radial dimension than the width of the traces extending from the clip. However, traces extending along the surface of the dielectric element are typically closely packed. Placement of the terminals on the dielectric layer also occupied by the traces leaves less room for the traces between the adjacent terminals. A microelectronic chip package configuration which maximizes the space available for placement of the traces, but which also allows use of relatively large terminals, would be desirable.

SUMMARY OF THE INVENTION

The present invention addresses these needs.

A semiconductor chip assembly in accordance with one aspect of the present invention includes a semiconductor chip having surfaces and contacts thereon and a dielectric element. The dielectric element his a top dielectric layer with a bottom surface facing towards the chip and a top surface facing away from the chip. The dielectric element also includes a bottom dielectric layer in addition to the top dielectric layer. The bottom layer has a top surface confronting the bottom surface of the top dielectric layer and a bottom surface facing toward the chip. The top dielectric layer may be formed as a coating on the bottom layer of the dielectric element or as a separate layer. A potential plane element may be disposed on the bottom surface of the bottom layer. Conductive traces extend at the bottom surface of the top dielectric layer. The traces may alternatively be formed on either the bottom surface of the top dielectric layer or the top surface of the bottom dielectric layer. Flexible conductive elements connect the traces with the contacts of the semiconductor chip so that the dielectric element is movable with respect to the chip. The top surface of the top dielectric layer has bonding terminals, each of the bonding terminals having an associated trace to which it is electrically connected. At least one of the traces extends beneath at least one of the bonding terminals to which that trace is not electrically connected. Thus, the traces of the assembly may be closely packed and the terminals may be freely arranged in a two-dimensional array, since the traces pass beneath the bonding terminals on the top surface of the dielectric layer.

Holes extend through the top dielectric layer so that the conductive traces on the bottom surface of the top dielectric layer may be connected to their associated terminals. Conductive elements may extend within the holes to connect the traces with the bonding terminals, or the terminals may extend within the holes to make direct contact with the traces. The bonding terminal on the top surface of the dielectric layer preferably projects outwardly in a radial direction away from the conductive element associated with the bonding terminal so that the bonding terminal extends along the top surface of the top dielectric layer.

The flexible conductive elements connecting the traces and contacts, which may comprise connection sections of the traces, are provided so that the dielectric element is movable with respect to the chip, to account for differential thermal expansion between the chip and the dielectric element. Preferably, a compliant layer is disposed between the dielectric element and the chip to take up the differential thermal expansion and to spread stress more evenly. Most preferably, the top and bottom dielectric layers are comprised of a flexible dielectric material. The top dielectric layer may be comprised of a high modulus dielectric material such as a polyimide or from an elastomeric dielectric material.

Preferably each bonding terminal is generally circular having an outer radius larger than the center-to-center spacing distances between the traces extending beneath the bonding terminal. The assembly may be configured so that at least some of the terminals are disposed in an area array covering a first region of the dielectric element and the traces may extend generally parallel to one another within the first region.

The chip may have a central region and a peripheral region with contacts arranged on a front surface of the chip in the peripheral region. In this arrangement, the dielectric element overlies the front surface of the chip in the central region of the chip. At least some of the terminals of the dielectric element may be disposed in a region overlying the central region of the front surface of the chip.

The present invention also provides a connection component for use in a semiconductor chip assembly as above-described. The connection component includes a dielectric element having a top dielectric layer with a top surface and an oppositely facing bottom surface. The dielectric element includes a bottom layer having a top surface confronting the bottom surface of the top dielectric layer and a bottom surface facing towards the chip. The bottom surface of the bottom layer may have an electrically conductive potential plane thereon. The top dielectric layer may be formed as a coating on the bottom layer of the dielectric element or as a separate layer, and may be formed from polyimide or elastomeric material. Conductive traces extend at the bottom surface of the top dielectric layer. Flexible conductive elements are adapted to connect the traces with the contacts of the semiconductor chip. The top surface of the top dielectric layer has bonding terminals electrically connected to the traces. Each of the bonding terminals have an associated trace to which it is electrically connected. At least one of the traces extends beneath at least one of the bonding terminals to which it is not electrically connected.

The connection component may also include a top dielectric layer having holes extending between the top and bottom surfaces of the dielectric layer and conductive elements, commonly referred to as via liners, extending through the holes to connect one of the traces to an associated bonding terminal on the top surface of the top dielectric layer. Each bonding terminal may be generally circular, projecting outwardly in a radial direction along the top surface of the top dielectric layer away from the conductive element or via liner associated with the bonding terminal.

A further aspect of the invention provides a connection component including a dielectric element including a top dielectric layer having oppositely facing top and bottom surfaces and conductive traces extending at the bottom surface of the top dielectric layer. The conductive traces have electrically conductive, solder-wettable pads, typically metallic pads. The top dielectric layer has holes in registration with the pads. Rings formed from a material wettable by a flowable electrically conductive bonding material, typically solder-wettable metallic rings, are provided on the top surface of the top dielectric layer. The rings have apertures in alignment with the holes and pads. The holes do not have conventional metallic via liners. Instead, the dielectric material of the top layer is exposed on the interior surfaces of the holes. Conductive masses can be formed by providing a flowable bonding material such as molten solder in contact with the rings and pads, so that the bonding material wets the rings and pads. Typically, the molten solder is provided by depositing solder masses such as solder balls into the holes, and then heating the assembly to melt the solder. This aspect of the invention incorporates the realization that the conventional via liners are unnecessary, in that the bonding material itself will extend through the holes to form electrical connections with the pads of the traces. To promote wetting to the pads, the top layer desirably is relatively thin and the hole diameter is greater than the top layer thickness. The rings act to confine and shape the solder or other bonding material on the top surface, so that the resulting mass has a well-controlled, generally rounded shape.

BRIEF DESCRIPTION OF THE DRAWINGS

These and other features, aspects, and advantages of the present invention will become better understood with regard to the following description, appending claims and accompanying drawings where:

DETAILED DESCRIPTION

Figure 1:
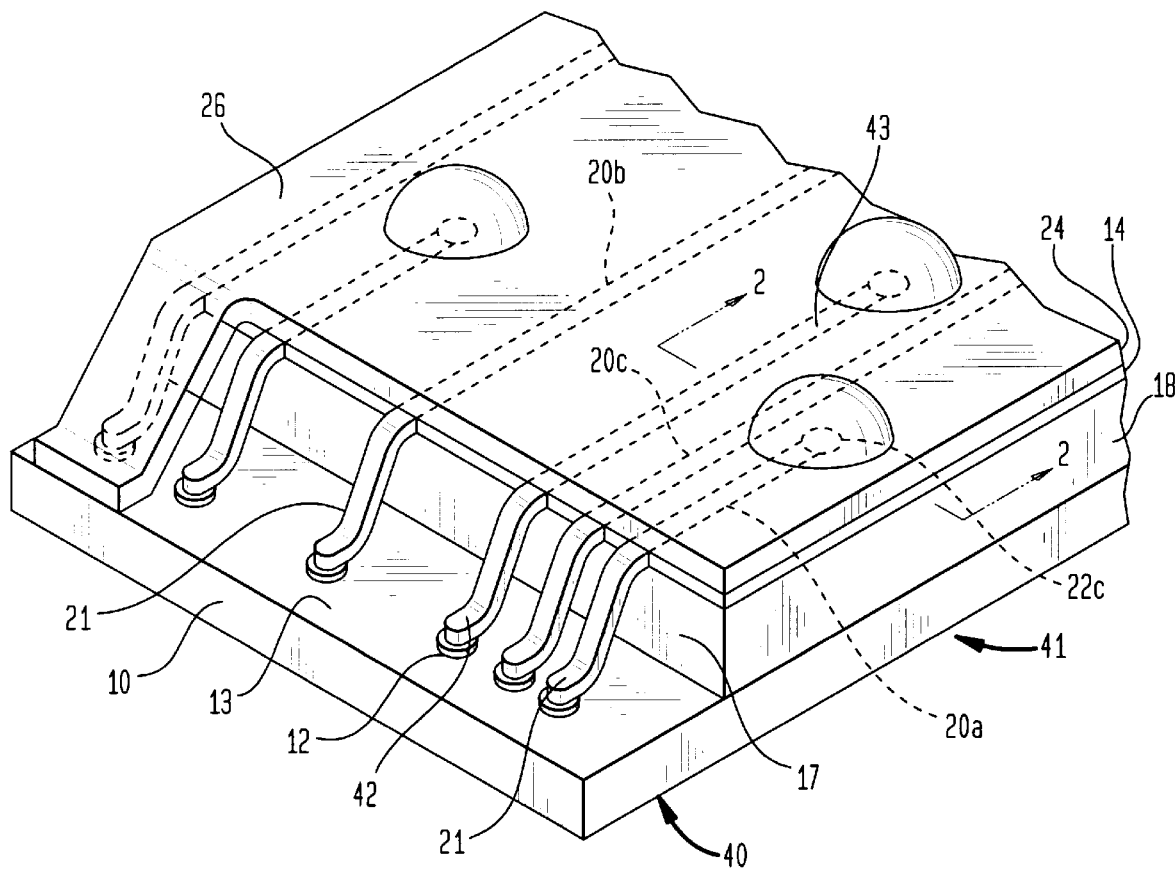
FIG. 1 is a fragmentary partially cut away perspective view of a chip assembly in accordance with one embodiment of the invention.

The present invention incorporates the realization that in a dual layer structure having leads on one surface and exposed bonding terminals on another surface, leads extending along the dielectric structure may be routed close to the holes or vias and may actually pass underneath the edges of the bonding terminals on the exposed surface remote from the chip to maximize the spacing between the terminals and between the leads. In a first embodiment shown in FIG. 1, the chip 10 has contacts 12 on a front surface 13. A dielectric element includes a first or bottom, flexible layer 14 having a first or bottom surface 15 facing towards the chip and a second or top surface 16 facing away from the chip. A compliant layer 18 is disposed beneath the first dielectric layer 14, between the first dielectric layer and the chip. Layers 14 and 18 may be formed integrally with one another, as a single layer, if desired, or layer 14 may be comprised of a separate, preformed layer of a dielectric such as polyimide. Layer 14 has traces or leads 20 extending along its second or top surface 16. Traces 20 may be formed, for example, by attaching a sheet of conductive material to layer 14 using an adhesive and employing conventional printed circuit techniques to form the traces from the layer of conductive material.

The dielectric element also includes a second or top dielectric layer 24 overlying the bottom layer 14. The second or top layer is comprised of a dielectric such as polyimide and may be formed by assembling a preformed polyimide layer with the first or bottom layer 14 using an adhesive, known in the art as providing a "overlay". The top layer 24 may alternatively be formed of material which is cast in place, such as spun-on polyimide or encapsulant applied to the top surface 16 of the bottom layer 14 covering the traces 20. Second layer 24 has a bottom surface 25 facing toward the chip 10 and confronting the top surface of bottom layer 14 and a top or second surface 26 forming the surface of the dielectric assembly remote from the chip. Holes 28 extend through the second layer 24 from the top surface 26 to the bottom surface 25. Holes 28 may be formed by a variety of conventional techniques. For example, where the top layer 24 is applied as a preformed layer, the holes may be incorporated in such layer. The second layer 24 may be formed with holes 28 by selectively applying a material on first or bottom layer 14 in a silk screening process or selective curing process. Alternatively, the holes may be formed by photographically patterning the top layer before or after formation of such layer, or by selectively ablating such layer.

The traces 20 may also be formed on the bottom surface 25 of top dielectric layer 24. Bottom layer 14 is then formed by applying to top layer 24 as a coverlay or a spun-on polyimide layer, as discussed above. Thus, traces 20 may be formed either on the bottom surface 25 of top dielectric layer 24 or the top surface 15 of bottom dielectric layer 14. In addition, either layer 24 or 14 may be formed first.

Chip 10 has a peripheral region 40 which extends beyond an edge 17 of the dielectric element and compliant layer 18. A central region 41 of the chip 10 is disposed beneath the dielectric element. The compliant layer 18 therefore covers the central region 41 of the chip. Contacts 12 are disposed on front surface 13 of the chip in the peripheral region 40, outside central region 41 and spaced from edge 17. Each trace 20 has a connection section or flexible lead 21 leading to a contact end 42. The connection section extends from the top surface 16 of the bottom dielectric layer 14 beyond edge 17 and curves vertically to the contact 12 on the peripheral region 40. Thus, traces 20 engage the contacts 12 of the chip at the contact end 42 of the connection section of the trace. At a terminal end 43 of each trace, opposite from the contact end 42, the trace 20 forms a pad 22. Each pad 22 is in alignment with a hole 28.

The connection sections or flexible leads 21 may be formed at the same time as the traces, or else may include separate flexible elements such as bonding wires, both as described in the aforementioned '265 and '266 patents. As also disclosed in these patents, connection sections 21 can be connected to contacts 12 on the chip 10 utilizing a tool which engages the contact end 42 of the connection section 21 so as to deform the connection section downwardly towards the associated contact 12.

Connection sections 21 of traces 20 are flexible to allow relative movement between the dielectric element and the chip. In addition, the compliant layer 18, first dielectric layer 14, and second dielectric layer 24 are comprised of flexible materials. The contact end 42 of each trace 20 is therefore movable in relation to terminal end 43 of the traces to respond to differences in thermal expansion between the chip 10 and the dielectric element. The '265 and '266 patents, which have been incorporated by reference herein, describe the movable relation of the chip and dielectric element in greater detail. Where second layer 24 is formed from compliant material such as a gel or elastomer, the second layer may be formed integrally with an encapsulant which encapsulates the contacts 12 and connection sections 21. A portion of this encapsulant is removed in FIG. 1 for clarity. The encapsulant covers and protects the junctures of the contacts and connection sections of the traces.

Figure 2:
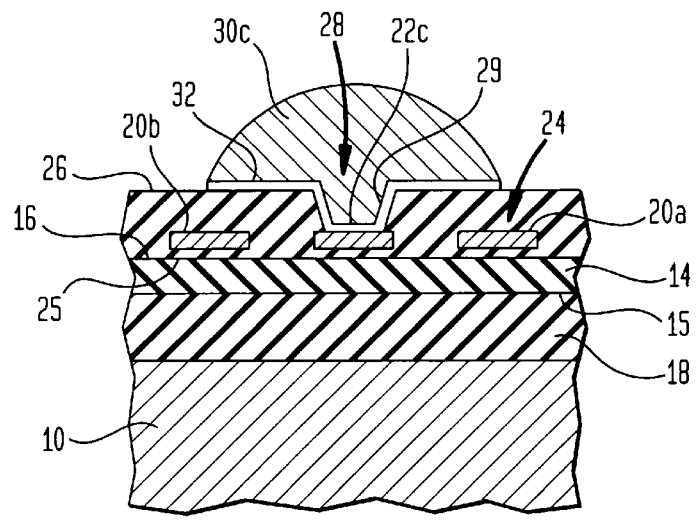
FIG. 2 is a diagrammatic sectional view taken along line 2—2 in FIG. 1.
Figure 3:
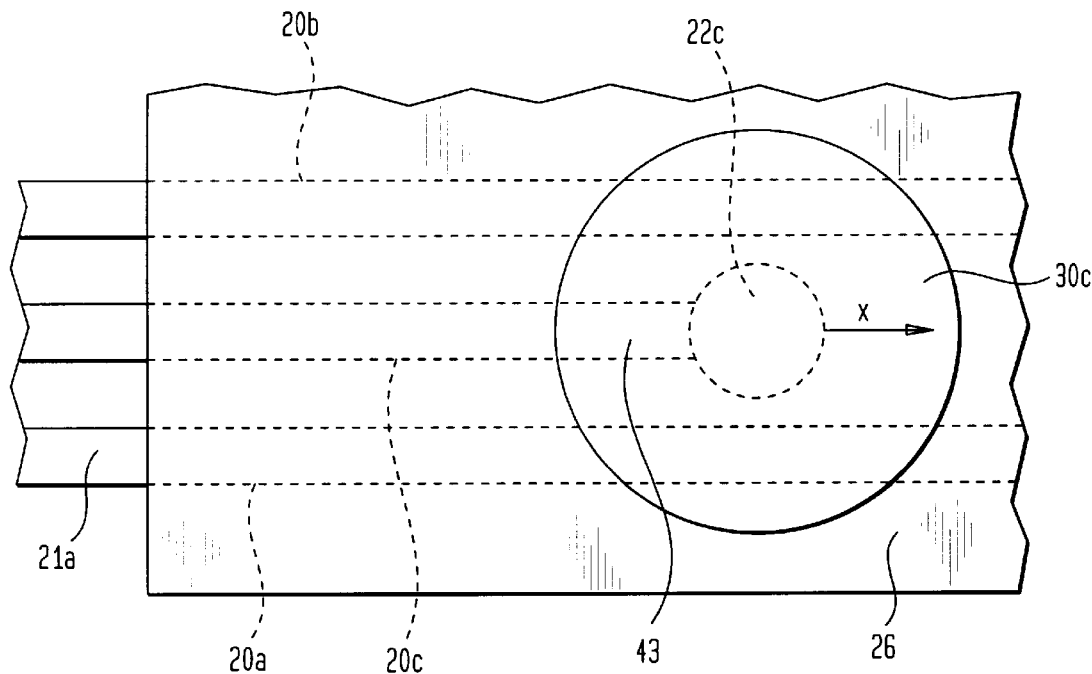
FIG. 3 is an enlarged fragmentary top view of the chip assembly of FIGS. 1 and 2.

Bonding terminals 30 are provided on the top surface 26 of top dielectric layer 24. Each bonding terminal is a metallic structure which includes a mass of electrically conductive material deposited in the associated hole 28 and electrically connected to the pad 22 associated with such hole. The bonding terminals 30 are formed by depositing a mass of electrically conductive bonding material such as solder or a conductive polymer within holes 28 previously formed in top dielectric layer 24. As best illustrated by FIG. 2, metallic via liners 29 line holes 28 and are electrically continuous with pads 22 whereas top surface pads 32 are electrically continuous with the via liners 29. The conductive mass of each bonding terminal 30 is in electrical contact with the top surface pad 32 and via liner 29. The mass of bonding material and surface pads 32 of each terminal 30 extend along the top surface 26 in a radial direction "x" in FIG. 3. As best appreciated with reference to FIGS. 2 and 3, each bonding terminal 30 may be of relatively large diameter, and may overlie adjacent traces 20. Thus, traces 20a and 20b pass beneath top surface terminal 30c which is electrically connected to pad 22c at the end of trace 20c. In other words, the spacings between adjacent traces can be smaller than the radius of a top surface bonding terminal 30c. The center to center spacing or "pitch" between the traces in the first embodiment is about 25 to 50 microns and the diameter of the terminals is 225 to 350 microns, and in some cases larger. This allows considerably greater flexibility in routing the traces along the available surface area of the dielectric structure. Thus, more traces can be accommodated using this configuration than using a configuration where the traces run entirely along the top or chip-remote surface of the structure. Stated another way, by placing some of the traces beneath the edges of the terminals, the design saves space which otherwise would be wasted.

Figure 4:
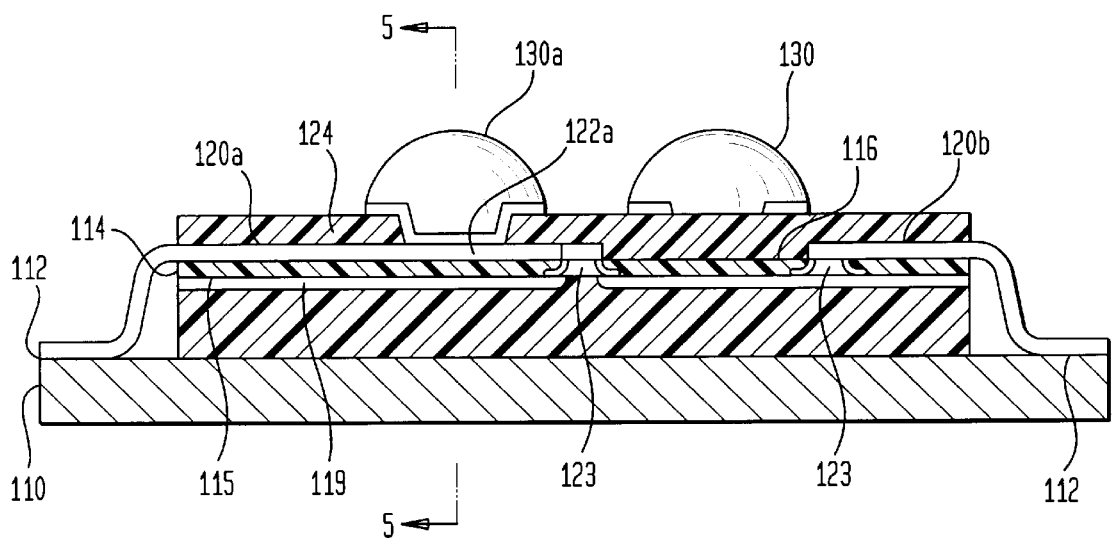
FIG. 4 is a diagrammatic sectional view of a chip assembly in accordance with another embodiment of the invention.
Figure 5:
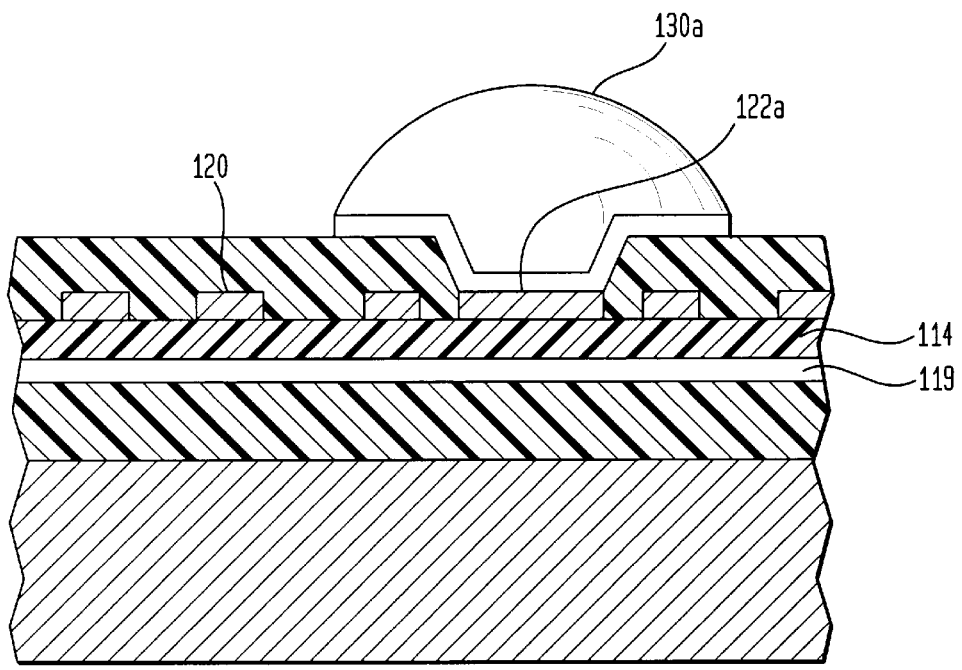
FIG. 5 is a fragmentary sectional view taken along line 5—5 in FIG. 4.

In a second embodiment depicted in FIGS. 4 and 5, an additional conductive element 119 is provided on the first surface 115 of the first dielectric layer 114. The particular conductive element shown in FIG. 4 is a potential plane 119, formed from a layer of conductive material, to serve as a power or ground plane. Such a potential plane cooperates with traces 120 on the second surface 116 of the first layer 114 to form stripline conductors, and reduces impedance in the traces. Potential plane 119 is connected to trace 120a by a through via 123 penetrating layer 114. Trace 120a has pad 122a connected to a top surface bonding terminal 130a associated with that trace. Plane 119 can be connected to an external potential source through bonding terminal 130a. Additional traces 120b can be connected to the potential plane by additional through vias 123. Thus, the power or ground potential carried on plane 119 can be distributed to numerous traces, and to numerous contacts 112 on chip 110, without occupying any additional bonding terminals 130. The other bonding terminals 130 are connected to other traces for signal transmission.

In further embodiments (not shown), additional traces are provided on the first surface of the bottom dielectric layer. These are selectively interconnected with traces on the second surface by through vias, and provide additional flexibility in routing the signals. For example, where a trace on one level must cross another trace or feature on that level, the traces can be brought up or down to another level to avoid the crossing trace or feature. In still further embodiments, additional layers with more traces and/or more potential planes are employed.

Figure 6:
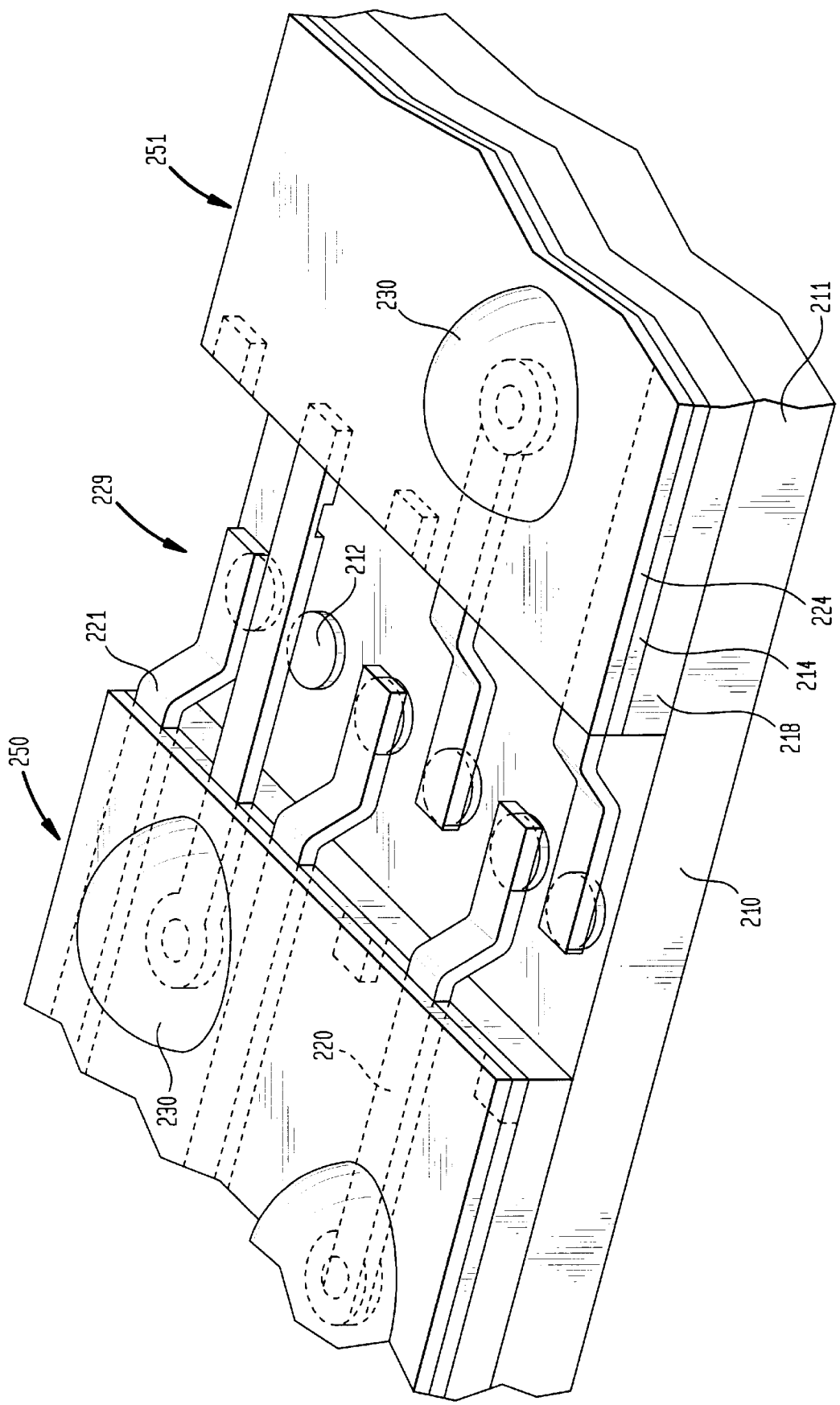
FIG. 6 is a fragmentary perspective view of a chip assembly in accordance with still another embodiment of the invention.

The configuration of the assembly discussed in connection with the first embodiment of the invention is called a "fan-in" configuration due to the placement of the terminals within the central region 41 of the chip 10. In a third embodiment of the invention, the assembly has a "fan-in/fan-out" configuration. FIG. 6 illustrates this configuration, having terminals on an inner portion of the dielectric element which overlies the central region 250 of the chip 210 in addition to terminals in an outer region 251 of the dielectric element which lies outboard of the contacts 212 of the chip. Thus, the outer region of the dielectric element may overlie a peripheral region of the chip 210 or may overlie a support structure 211 extending alongside the chip. The top dielectric layer 224 and bottom dielectric layer 214 of the dielectric element, the compliant layer 218, the traces 220 and the bonding terminals 230 are formed in accordance with the methods discussed above. As disclosed, for example, in commonly assigned International Publication WO 94/03036, the disclosure of which is hereby incorporated by reference herein, the connection sections 221 of the flexible leads may extend across a gap 229 in the dielectric layer, so that the connection sections are supported at both ends prior to assembly with the chip. The connection sections may be detached at one end by engaging them with a tool and forcing them downwardly into the gap to engage the contacts 212. As seen in FIG. 6, the resulting assembly has traces 220 extending beneath some of the bonding terminals to which the traces are not electrically connected.

Figure 8:
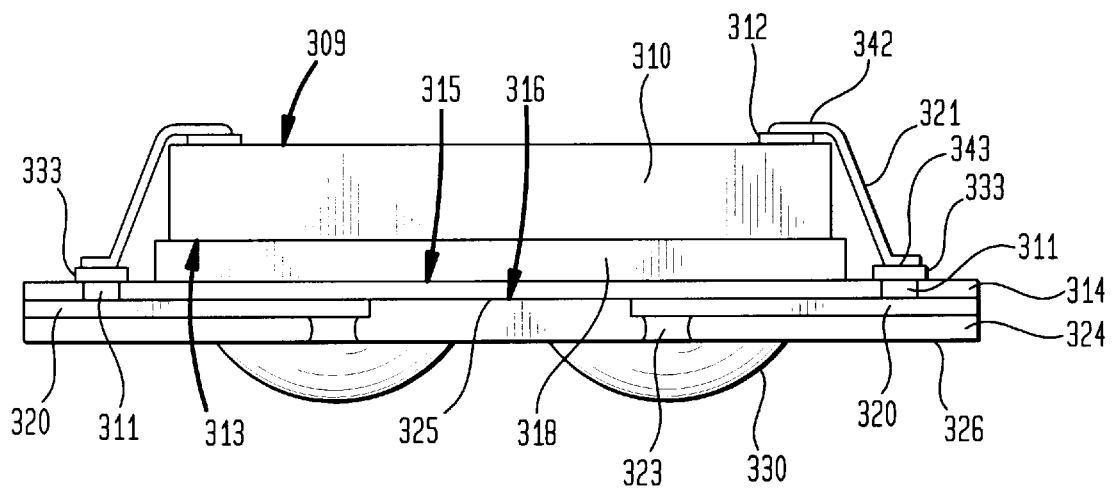
FIG. 8 is a diagrammatic sectional view taken along line 8—8 in FIG. 7.

In a fourth embodiment, as illustrated in FIGS, 7–9, the invention is employed in a "face-up" microelectronic assembly. In a "face-up" assembly, a rear surface 313 of the chip 310 faces towards the dielectric element and confronts the compliant layer 318. The dielectric element includes a bottom dielectric layer 314 and a top dielectric layer 324. Bottom layer 314 has a bottom surface 315 confronting the compliant layer 318 and a top surface 316 confronting the top dielectric layer 324. Top dielectric layer 324, has a bottom surface 325 and a top surface 326. The top surface 326 is the surface remote from the chip 310 and is shown facing downwardly in FIG. 8. As is evident from this discussion and from the drawings, "top" and "bottom" as used in this disclosure are defined relative to the assembly and not to any relationship with gravitational forces acting on the assembly.

The chip 310 has contacts 312 arranged on a front surface 309 of the chip. Flexible leads 321, which may be formed utilizing a wire bonding tool, as is known in the art, are bonded to the contacts 312 at contact end 342 of the lead. The flexible lead 321 has a terminal end 343, opposite the contact end 342, bonded to connectors 333 on the bottom surface 315 of layer 314. Connectors 333 are connected to electrically conductive material extending through vias 311. Each via 311 connects a flexible lead 321 to a trace 320 extending at bottom surface 325.

Figure 7:
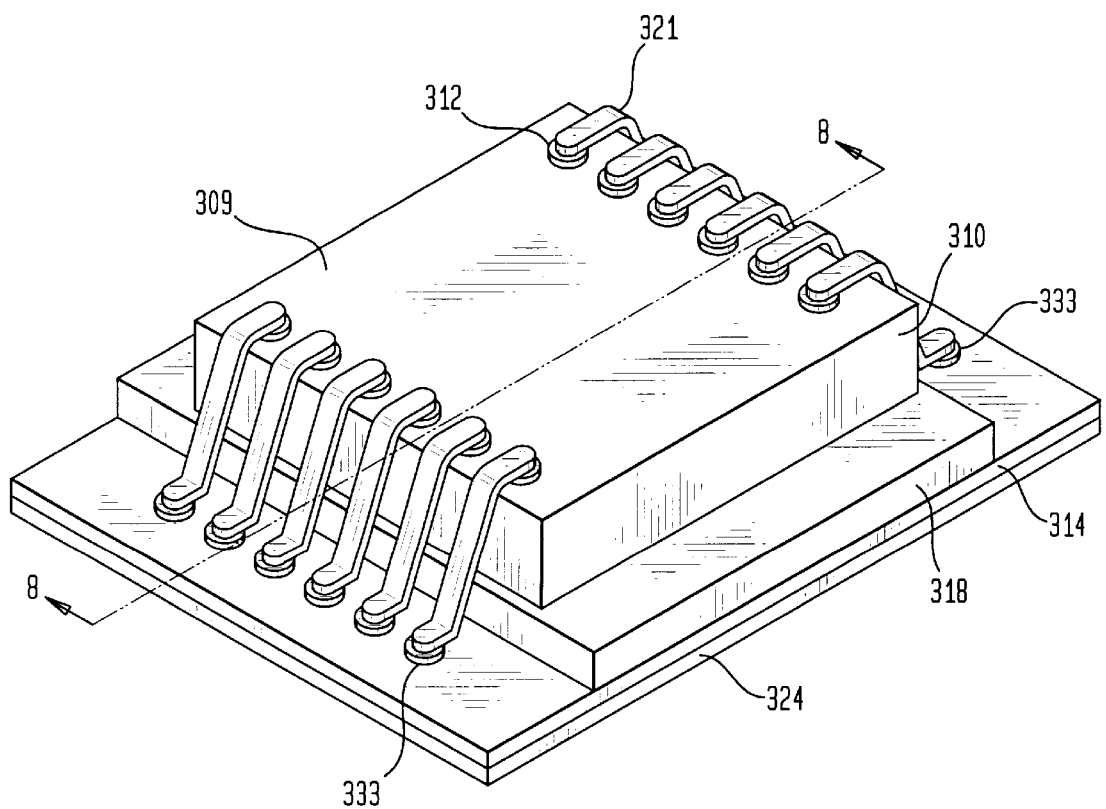
FIG. 7 is a diagrammatic perspective view of a chip assembly in accordance with another embodiment of the invention.
Figure 9:
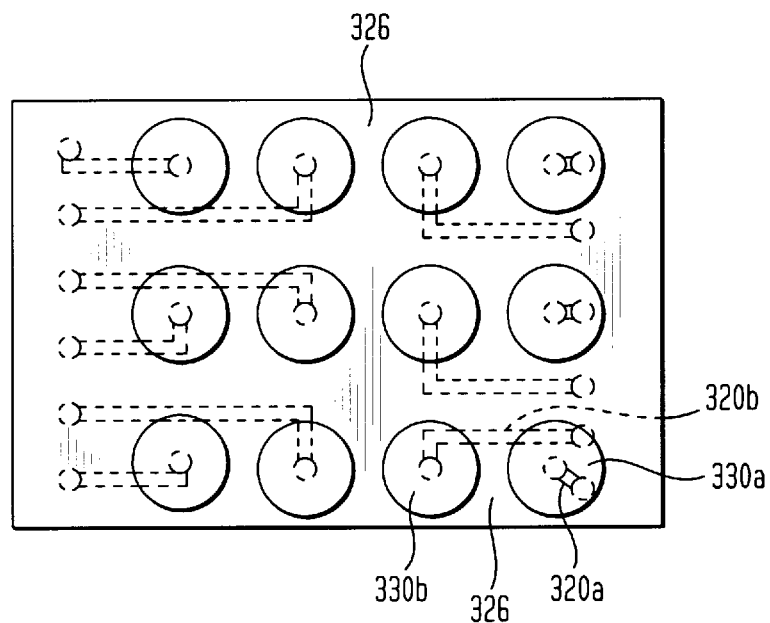
FIG. 9 is a diagrammatic bottom view of the chip assembly of FIGS. 7–8.

Terminals 330 are provided on the top surface 326 to connect the assembly to other electronic devices. Terminals 330 are connected to traces 320 by electrically conductive material extending through via 323. As best illustrated by FIGS. 7 and 9, the contacts 312 are arranged in rows on the front surface 309 of the chip 310, whereas terminals 330, which can be larger than contacts 312, are arranged in an area array to maximize the surface area of the terminals at surface 326 of the dielectric element. FIG. 9 illustrates that traces 320 extend beneath terminals to which they are not electrically connected. For example, the trace 320b associated with terminal 330b extends beneath terminal 330a.

Figure 10:
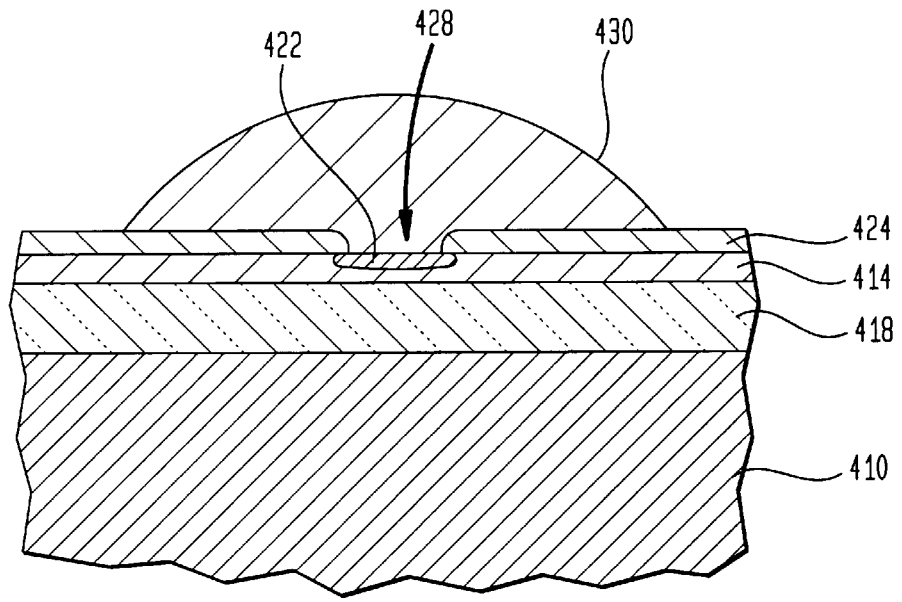
FIG. 10 is a diagrammatic sectional view of a chip assembly in accordance with yet another embodiment of the invention.

In a fifth embodiment, the conductive mass of the bonding terminals of the assembly are in direct electrical contact with the pads 422, without the via liners 29 and top surface pads 32 of FIG. 2. FIG. 10 illustrates a bonding terminal 430 formed by depositing a mass of conductive bonding material in holes 428 of the top dielectric layer 424. The remaining features of the assembly are similar to those features discussed above in connection with the first embodiment.

Figure 11:
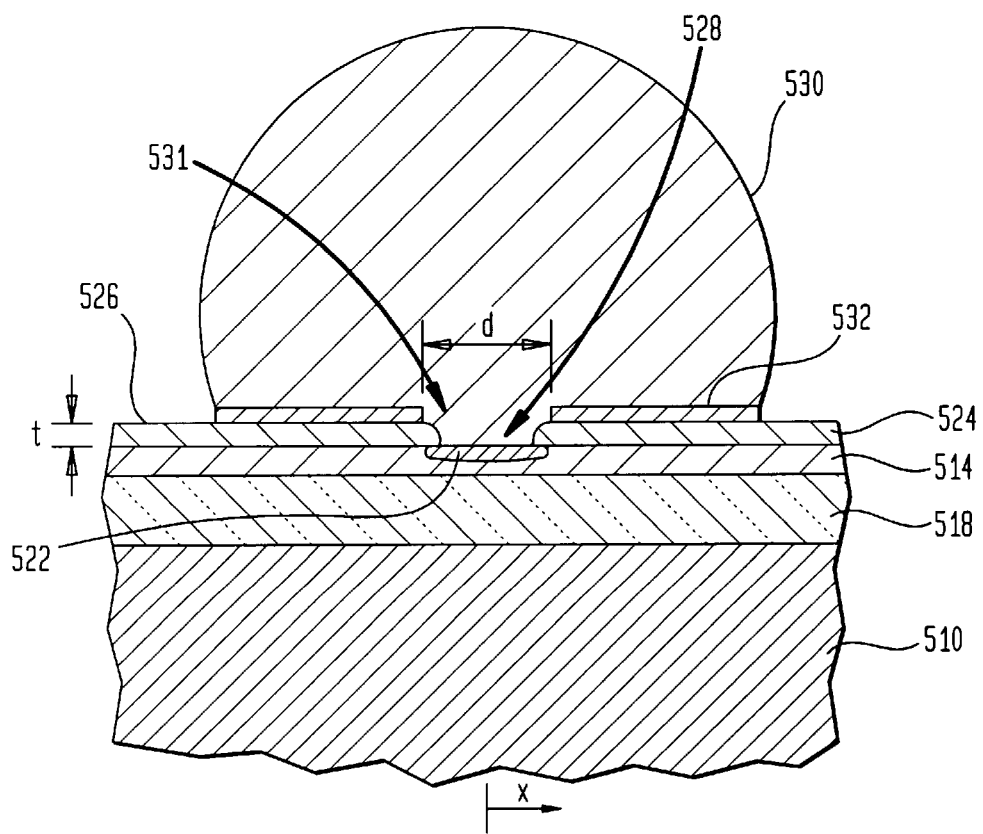
FIG. 11 is a diagrammatic sectional view of a chip assembly in accordance with another embodiment of the invention.

In a sixth embodiment illustrated by FIG. 11, masses of solder or other conductive bonding material 530 are in direct electrical contact with pads 522 and rings 532 of electrically conductive material. Rings 532 may be formed on the top surface 526 of top dielectric layer 524 by selective plating methods known in the art. Alternatively, the rings 532 are formed by applying a layer of conductive material on the top surface 526 and etching the layer to form the rings in registry with the pads. Each ring 532 has a central aperture 531 in alignment with one pad 522. Holes are formed by applying thermal energy such as highly concentrated light from a laser onto the rings. The rings block the laser light except within their central apertures 531, so that the laser light impinges on the top dielectric layer only within the central apertures, and ablates the dielectric material of the top ring so as to form holes 528 in alignment with apertures 531 and extending to pads 522.

In a method according to a further embodiment of the invention, a mass of a conductive material such as a conventional solder ball is deposited into each hole 528. The assembly is then heated, so as to melt the solder. The molten solder at each hole contacts the pad 522 in the hole, and also contacts the ring 532, so that the solder bridges over the exposed dielectric material within the interior of the hole. Upon melting the mass of conductive material, the solder fills hole 528 and spreads along the ring 532, outwardly in a radial direction away from the hole 528 to cover the ring 532. Because the solder does not wet the dielectric material, it does not spread beyond the ring 532. Due to the surface tension of the molten solder, the mass takes on a predictable shape. The outer periphery of the solder mass is shaped by surface tension forces between the solder and the ring in substantially the same way as solder masses formed on conventional terminals. Each hole 528 and the central aperture in each ring 532 have an internal diameter "d" greater than the thickness "t" of the top dielectric layer 524. Desirably, diameter d is about 5 times thickness t or more.

Both dimensions "d" and "t" are shown in shown in FIG. 11. Stated another way, the diameter to thickness ratio or "aspect ratio" of each hole desirably is more than 1:1 and more desirably 5:1 or more. The thickness "t" typically is less than 100 μm (4 mils) and more typically less than 75 μm (3 mils). These dimensions facilitate contact between the conductive material and the pad 522. The conductive material masses typically are formed entirely from a conventional solder. However, so-called "solid-core solder balls", which incorporate a core of a material having a higher melting point than the solder may be employed. The use of such solid core solder balls in certain connection components is described more fully in copending, commonly assigned U.S. patent application Ser. No. 08/411,472, entitled MICROELECTRONIC CONNECTIONS WITH SOLID CORE JOINING UNITS, the disclosure of which is hereby incorporated by reference herein. Conventional fluxes may be employed in the process. In variants of the process, the solder may be replaced by other flowable bonding materials. In further variants, the pads and traces may be formed on a bottom dielectric layer, whereas the rings may be formed on a separate top dielectric layer, which is assembled to the bottom layer either before or after the step of forming the holes in the top layer, so that the pads are positioned beneath the holes. Alternatively, the pads and traces may be formed on the bottom surface of the top layer, and a separate bottom layer may be applied at any time after formation of the pads and traces. In all of these variants, there is no need to plate metal into the interior of holes 528.

The electrically conductive elements discussed above may be comprised of conventional materials known in the art and commonly employed for semiconductor chip leads. Metals such as copper, gold, silver, copper based alloys, etc. can be employed. The terminals of electrically conductive bonding material may be comprised of composite materials such as conductive epoxies, metal filled polymers or conductive polymers, as well as metals known as soldering or brazing alloys. Also, instead of the flexible leads discussed above, the deformable conductive elements connecting the traces to the chip may be formed from low-melting metallic materials or other liquid conductive material as described in International Publication No. 97/40958, the disclosure of which is also incorporated by reference herein.

As will be appreciated, numerous variations and combinations of the features discussed above can be utilized without departing from the present invention as defined by the claims. Accordingly, the forgoing description of the preferred embodiments should be taken by way of illustration rather than by way of limitation of the invention.

I claim:

1. A semiconductor chip assembly comprising:
   (a) a semiconductor chip having surfaces and having contacts thereon;
   (b) a dielectric element including a top dielectric layer having a bottom surface facing towards the chip and a top surface facing away from the chip, said dielectric element further including a bottom layer having a top surface confronting said bottom surface of said top dielectric layer and a bottom surface facing toward the chip, said dielectric element including conductive traces extending at said bottom surface of said top dielectric layer;
   (c) deformable conductive elements connecting said traces with said contacts, so that said dielectric element is movable with respect to said chip to compensate for thermal expansion; and
   (d) bonding terminals on said top surface of said top dielectric layer, said bonding terminals having radial dimensions, at least some of said traces extending side-by-side at center-to-center spacings smaller than the radial dimensions of said bonding terminals, at least one of said bonding terminals overlying a plurality of said side-by-side traces but being electrically connected to any one of said plurality of side-by-side traces whereby at least another one of said plurality of side-by-side traces extends beneath at least one of said bonding terminals to which such trace is not electrically connected.

2. An assembly as claimed in claim 1 wherein said top dielectric layer has holes therein extending between said top and bottom surfaces and conductive elements extending through said holes to connect one said trace associated to an associated bonding terminal.

3. An assembly as claimed in claim 1 wherein each said bonding terminal projects outwardly in a radial direction away from the associated conductive element along the top surface of said top dielectric layer.

4. An assembly as claimed in claim 3 wherein said deformable conductive elements comprise flexible conductive elements.

5. An assembly as claimed in claim 1 further comprising an electrically conductive potential plane element on said bottom surface of said bottom layer, between the chip and said bottom layer.

6. An assembly as claimed in claim 1 wherein said top dielectric layer is formed as a coating on said bottom layer.

7. An assembly as claimed in claim 1 wherein said top dielectric layer is formed from polyimide.

8. An assembly as claimed in claim 1 wherein each said bonding terminal is generally circular.

9. An assembly as claimed in claim 8 wherein at least some of said terminals are disposed in an area array covering a first region of said dielectric element and wherein said side-by-side traces extend within said first region.

10. An assembly as claimed in claim 1 wherein said chip has a front surface with said contacts thereon and wherein said dielectric element overlies said front surface.

11. An assembly as claimed in claim 10 wherein at least some of said terminals are disposed in a region of said dielectric element overlying a central region of said front surface of the chip and wherein said contacts on the chip are disposed in a peripheral region outside of said central region.

12. A connection component for a semiconductor chip comprising:
   (a) a dielectric element including a top dielectric layer having oppositely facing top and bottom surfaces, said dielectric element further including a bottom layer having oppositely facing top and bottom surfaces, said top surface of said bottom layer confronting said bottom surface of said top dielectric layer, said dielectric element including conductive traces extending at said bottom surface of said top dielectric layer;
   (b) deformable conductive elements adapted to connecting said traces with contacts of a semiconductor chip when the connection component is juxtaposed with a chip; and
   (c) bonding terminals on said top surface of said top dielectric layer, said bonding terminals having radial dimensions, at least some of said traces extending side-by-side at center-to-center spacings smaller than the radial dimensions of said bonding terminals, at least one of said bonding terminals overlying a plurality of said side-by-side traces but being electrically connected to only one of said plurality of side-by-side traces, whereby at least another one of said plurality of side-by-side traces extends beneath at least one of said bonding terminals to which such trace is not electrically connected.

13. A connection component as claimed in claim 12 wherein said top dielectric layer has holes therein extending between said top and bottom surfaces and conductive elements extending through said holes to connect each said bonding terminal to said associated trace.

14. A connection component as claimed in claim 12 wherein each said bonding terminal projects outwardly in a radial direction away from the associated conductive element along the top surface of said top dielectric layer.

15. A connection component as claimed in claim 12 wherein said deformable conductive elements comprise flexible conductive elements.

16. A connection component as claimed in claim 12 further comprising an electrically conductive potential plane element on said bottom surface of said bottom layer.

17. A connection component as claimed in claim 12 wherein said top dielectric layer is formed as a coating on said bottom layer.

18. A connection component as claimed in claim 12 wherein said top dielectric layer is formed from polyimide.

19. A connection component as claimed in claim 12 wherein each said bonding terminal is generally circular.

20. A connection component as claimed in claim 19 wherein at least some of said terminals are disposed in an area array covering a first region of said dielectric element and wherein said side by side traces extend within said first region.

* * * * *

UNITED STATES PATENT AND TRADEMARK OFFICE
CERTIFICATE OF CORRECTION

PATENT NO. : 5,994,781
DATED : November 30, 1999
INVENTOR(S) : John W. Smith

It is certified that error appears in the above-identified patent and that said Letters Patent is hereby corrected as shown below:

Column 5, line 26, "overlay" should read --"coverlay"--.

Signed and Sealed this

Fifteenth Day of August, 2000

Attest:

Q. TODD DICKINSON

Attesting Officer      Director of Patents and Trademarks